United States Patent [19]

Kestelman et al.

[11] Patent Number: 5,217,748
[45] Date of Patent: Jun. 8, 1993

[54] METHOD OF HARDENING METAL SURFACES

[75] Inventors: Vladimir N. Kestelman, Pennsauken, N.J.; Tatjana Zlatina, Charkov, U.S.S.R.

[73] Assignee: Development Products, Inc., Moorestown, N.J.

[21] Appl. No.: 796,943

[22] Filed: Nov. 25, 1991

[51] Int. Cl.$^5$ .............................. B05D 3/06
[52] U.S. Cl. .................... 427/580; 427/250; 427/255.1; 427/294; 427/569
[58] Field of Search ............... 427/37, 250, 255.1, 427/294

Primary Examiner—Bernard Pianalto
Attorney, Agent, or Firm—Simpson & Simpson

[57] ABSTRACT

A coating is provided to a substrate in a vacuum chamber having an electric arc evaporator to form an ion-plasma comprising accelerated ions and neutral atoms of evaporated metal. The substrate contained in the vacuum chamber is provided with a negative voltage bias such that the ion-plasma is drawn to the substrate and deposited on its surface to provide the coating. A pulsed negative voltage bias is maintained on the substrate such that the substrate temperature can be maintained within the range of zero to 200° C.

2 Claims, 1 Drawing Sheet

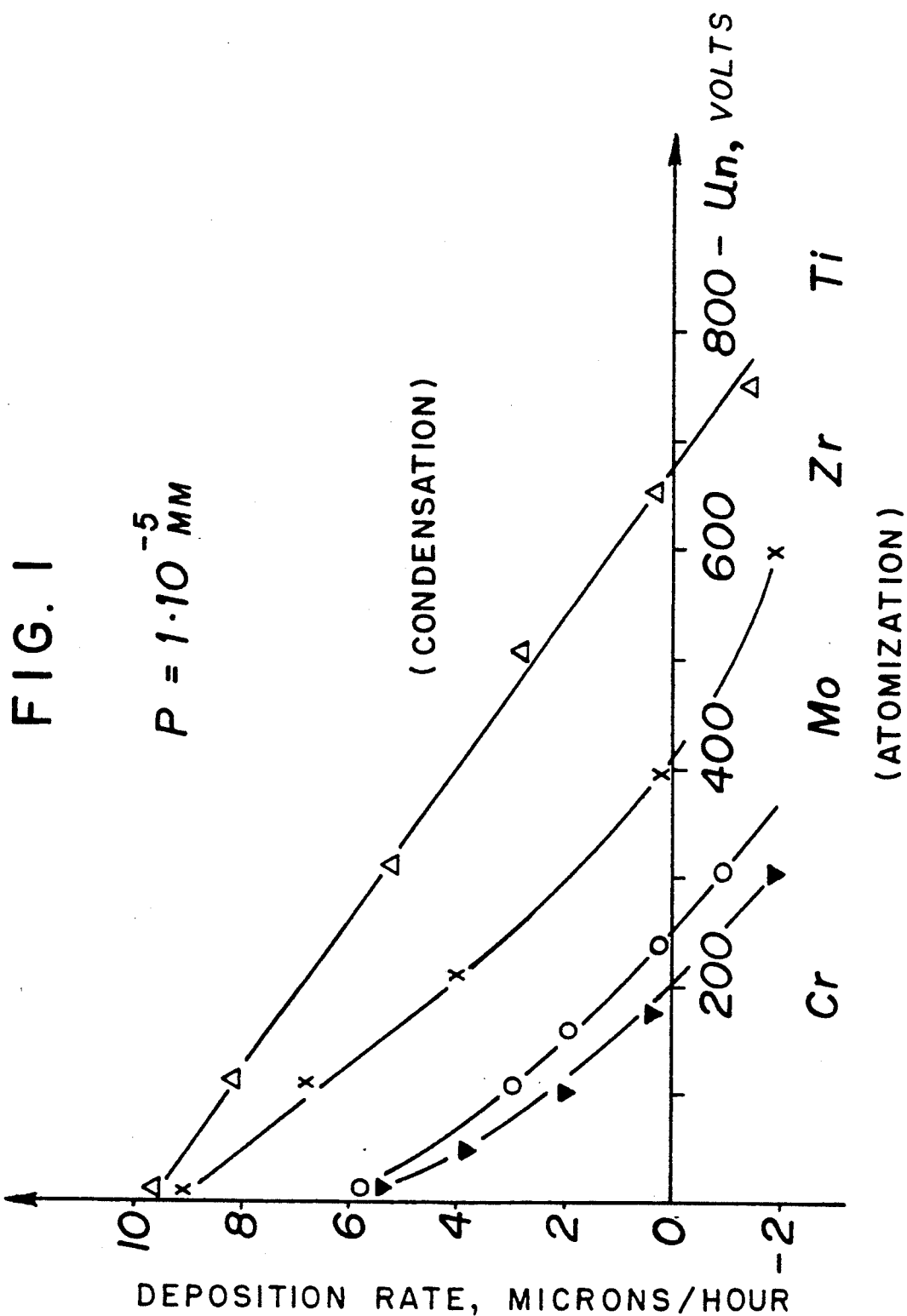

METHOD OF HARDENING METAL SURFACES

BACKGROUND OF THE INVENTION

This invention relates to the application of coatings in vacuum and finds particular use in the machine-building industry and other fields of engineering. The method is intended mainly for obtaining the wear-resistive coatings on the parts of machines and tools participating at a reduced temperature (0° to 200° C.).

At present, it is common knowledge that to obtain strong coatings with a satisfactory adhesion to the substrate, it is necessary to maintain the substrate temperature at the level of several hundred degrees. This is especially true for coatings of refractory metal compounds such as titanium and zirconium nitrides. At a temperature of the substrate of less than 300° C., the coatings become fragile and spontaneously separate. That is why, at present, the articles made of structural and carbon steels are not hardened with vacuum-plasma coatings.

A prior art method suggests treating the articles made of conducting materials (U.S.S.R. Inventor's Cert. No. 891217, cl. C23C 15/00). Usually, the surface of any article has a defective layer due to the previous machining. Presence of the defects on the surface reduces the strength of the article as a whole and increases its fragility. The articles are treated with a flux of neutral atoms and ions of the metal having an energy of 0.2 to 2 keV; the amount of ions constitutes 30 to 95% of the total flux. Such a treatment tends to heal the macro and microdefective surfaces, which increases the hardness of the article as a whole.

To perform hardening using the said method, the article is immersed into the vacuum chamber accommodating the electric-arc evaporator, the chamber is depressurized to a high vacuum, a negative voltage of several hundreds of volts is applied to the article, and the evaporator is turned on for three to five minutes. Simultaneous treatment of the article with accelerated ions and neutral atoms of evaporated metal ensures an increase in mobility of the deposited metal atoms, healing of the surface defects and, as a consequence, an increase of the article hardness.

Such ion-plasma treatment of the articles having previously applied wear-resistive coating has not shown a positive effect probably because of the presence of concealed defects in the depth of the coating layer which cannot be reached by the atoms of the healing metal.

The object of the present invention is to increase the wear-resistivity of the coatings.

The object is attained by depositing the coating in the presence of reaction gas while the substrate temperature is maintained in the range of 0° to 200° C., preferably below 100° C. The substrate is subjected to pulses of negative voltage with an amplitude defined generally by the relationship:

$$0.5 U_{sl} \leq U_n \leq 4 U_{sl}$$

with pulse amplitude preferably in the range of 0.5 to 10 kilovolts; with a pulse duration defined generally by the relationship:

$$10 \delta_o C_o \leq t_{pls} \leq 200 \delta_o / C_o$$

with pulse duration preferably in the range of 0.1 to 25 seconds; and the ratio of pulse period to pulse duration in the range of 2 to 10. In these relationships:

$U_n$ is the substrate voltage;
$U_{sl}$ is the voltage on the substrate at which the coating deposition rate in the high vacuum without feeding the reaction gas is equal to zero;
$t_{pls}$ is the duration of pulses in seconds;
$C_o$ is the coating deposition rate in Angstroms per second;
$\delta_o$ is the thickness of monolayer, Angstroms.

Between voltage pulses, a layer of compounds of the evaporated metal and gasified reactant is deposited on the cool substrate; this layer may have many defects. The lower the temperature of the substrate, the more defective this layer may be. When a voltage pulse is then applied to the substrate, bombardment by ions together with the neutral atoms occurring in the process "heals" the defects of the deposited layer, i.e., causes recrystallization, and increases coating hardness. Because of a small duration of the pulse, the substrate has no time to be warmed up. The substrate temperature can thus be maintained within 0° to 200° C. with appropriate cooling.

With increasing substrate temperature, the physical and mechanical properties of the obtained coatings deteriorate; when the substrate temperature exceeds 200° C., the "healing" effect disappears. The layer-by-layer healing of the microdefects ensures a high wear-resistivity of the coating as a whole.

With a voltage pulse duration less than $10 \delta_o/C_o$, the process of "healing" the defects, i.e., recrystallization, is incomplete, and the coating remains fragile and insufficiently strong. When the pulse duration exceeds $200 \delta_o/C_o$, the temperature of the lower sublayers and the base increases, producing a coating in which the mechanical properties of the coating as a whole are reduced.

BRIEF DESCRIPTION OF THE DRAWING

The amplitude of pulses is of significant importance. The most effective are the amplitude values with a range of $(0.5-4) U_{sl}$. The Figure shows the relationship between the deposition rate and the voltage value on the substrate with deposition rate as function of the negative voltage value on the substrate when depositing the coating in a high vacuum. The voltage at which the relationship goes through zero is essentially $U_{sl}$.

The value of $\delta_o$ is usually of the order of 1.5 to 2 Angstroms, depending on the atomic weight of the used metal. At a voltage of less than $0.5 U_{sl}$, the effectiveness of healing the defects is considerably reduced. With the voltage exceeding $4 U_{sl}$, the coating wear-resistivity is reduced, which is probably associated with the local overheating of the layer.

The amplitude and duration of the voltage pulses are directly associated with the duration of the deposition process. The longer the period, the thicker the deposited layer, and the longer the time and the greater the energy required for its healing. Experiments have shown that the ratio between the duration of pulses and the period of deposition should be within 1:2 to 10. At a smaller value, a continuous layer of material can barely be formed and, at a greater value, the defects appear embedded in the layer which cannot be healed.

Distinguishing features of the present invention are the described conditions of depositing the coating and its ion treatment in the course of deposition which make it possible to obtain the positive effect (the possibility of creating the coating on a cold substrate) which does not occur in the case of using the analogous or prior art methods.

Example of the Method Implementation

The vacuum chamber provided with the electric-arc evaporator for titanium was depressurized down to a pressure of $2 \times 10^{-5}$ mm. Hg. A voltage of 1 kV was applied to the substrate and the evaporator was turned on for 10 seconds, thus performing the ion cleaning of the substrate. Then nitrogen was let into the chamber and its pressure was brought to a value of $4 \times 10^{-3}$ mm. Hg., and the evaporator and the generator supplying the substrate with the high voltage pulses was turned on. Within five minutes, the process was stopped. The obtained coating having a thickness of 1.5 microns was checked for abrasive wear-resistivity. For this purpose, a steel ball, diameter 8 mm., was pressed against a fine-grained sandpaper with an effort of 50 g. and was displaced in a reciprocating-motion manner at a rate of 0.5 meters/second. The number of displacements till wearing of the coating layer was considered the wear-resistivity degree. The test results are presented in the table below.

TABLE

| Pulse Amplitude, Volts V. ($U_{sl}$ = 700) | Wear-resistivity | | | | | |
|---|---|---|---|---|---|---|
| | Pulse duration for pulse period-to-pulse duration ratio of 10 | | | Pulse duration for pulse period-to-pulse duration ratio of 2 | | |
| | 1.3 Sec. | 13 Sec. | 26 Sec. | 1.3 Sec. | 13 Sec. | 26 Sec. |
| 0 | * | * | * | * | * | * |
| 210 | * | * | * | * | * | * |
| 350 | * | 100 | 40 | 160 | 120 | 80 |
| 700 | 180 | 180 | 80 | 180 | 180 | 10 |
| 280 | 120 | 80 | 40 | 60 | 45 | 10 |
| 350 | 10 | 10 | 10 | 10 | 10 | 10 |

*Indicates the coating is spontaneously damaged.

In the case where the pulse period-to-pulse duration ratio exceeds 10, it results in obtaining fragile and coatings lacking in strength. At a pulse period-to-pulse duration ratio of less than 2, the wear-resistivity remains at a level of less than 10, which is insufficient.

At a substrate temperature of 30° C., a coating made of titanium nitride deposited without application of voltage pulses, or with application according to the prior art method, is spontaneously separated from the steel substrate. Thus, the suggested method at a low temperature of the substrate ensures high wear-resistivity characteristics of the coating.

What is claimed is:

1. In a method for applying a coating using vacuum-arc evaporation of the coating material with subsequent deposition on a substrate subjected to negative voltage pulses, the improvement comprising, to increase the wear-resistivity of the coating, the substrate temperature is maintained within the range of 0 to 200° C., the deposition is carried out in the presence of gaseous reactant, the amplitude of pulses is $$0.5 U_{sl} \leq U_n \leq 4 U_{sl},$$

the duration of pulses is within $$10\, \delta_o/C_o \leq t_{pls} \leq 200\, \delta_o/C_o$$

and the pulse period-to-pulse duration ratio is 2 to 10, where:

$U_{sl}$ is the voltage on the substrate at which the coating deposition rate in the high vacuum without feeding the reaction gas is equal to zero.

$\delta_o$ is the thickness of monolayer, Angstroms; and $C_o$ is the coating deposition rate at a floating potential of the substrate in the presence of reaction gas, Angstroms/seconds.

2. A method in accordance with claim 1 in which the substrate temperature is maintained below 100° C., the pulse amplitude is in the range of 0.5 to 10 kilovolts, and the pulse duration is in the range of 0.1 to 25 seconds.

* * * * *